(12) United States Patent
Markus et al.

(10) Patent No.: US 10,025,118 B1
(45) Date of Patent: Jul. 17, 2018

(54) PIEZOELECTRIC ENERGY HARVESTING CONTACT LENS

(71) Applicants: David T. Markus, Irvine, CA (US); Michael C. Hayes, Irvine, CA (US)

(72) Inventors: David T. Markus, Irvine, CA (US); Michael C. Hayes, Irvine, CA (US)

( * ) Notice: Subject to any disclaimer, the term of this patent is extended or adjusted under 35 U.S.C. 154(b) by 461 days.

(21) Appl. No.: 14/337,213

(22) Filed: Jul. 21, 2014

Related U.S. Application Data

(60) Provisional application No. 61/856,661, filed on Jul. 20, 2013.

(51) Int. Cl.
| | |
|---|---|
| *H02N 2/18* | (2006.01) |
| *G02C 11/00* | (2006.01) |
| *G02C 7/04* | (2006.01) |
| *H01L 41/113* | (2006.01) |
| *G02C 13/00* | (2006.01) |
| *B65B 5/04* | (2006.01) |
| *B65B 7/16* | (2006.01) |

(52) U.S. Cl.
CPC ............... *G02C 11/10* (2013.01); *B65B 5/04* (2013.01); *B65B 7/16* (2013.01); *G02C 7/04* (2013.01); *G02C 13/001* (2013.01); *H01L 41/113* (2013.01)

(58) Field of Classification Search
CPC .................................. H02N 2/186; G02C 5/00
USPC .................................................. 310/339, 319
See application file for complete search history.

(56) References Cited

U.S. PATENT DOCUMENTS

| | | | | |
|---|---|---|---|---|
| 4,922,913 | A * | 5/1990 | Waters, Jr. ............... | A61B 3/16 600/398 |
| 6,954,025 | B2 * | 10/2005 | Nishida ................... | H01L 27/20 257/E27.006 |
| 2002/0043895 | A1* | 4/2002 | Richards ................. | F02B 75/34 310/328 |
| 2006/0095128 | A1* | 5/2006 | Blum ..................... | A61F 2/1627 623/6.37 |
| 2008/0114424 | A1* | 5/2008 | Grenon .................... | A61F 7/12 607/96 |
| 2008/0174273 | A1* | 7/2008 | Priya .................... | H01L 41/1136 320/114 |
| 2010/0237748 | A1* | 9/2010 | Malkin ................. | H02N 2/186 310/339 |
| 2012/0068576 | A1* | 3/2012 | Lee ..................... | H01L 41/1136 310/339 |
| 2012/0268712 | A1* | 10/2012 | Egan ...................... | G02C 7/085 351/159.34 |
| 2013/0313946 | A1* | 11/2013 | Lee ....................... | H02N 2/188 310/339 |

* cited by examiner

*Primary Examiner* — Bryan Gordon
(74) *Attorney, Agent, or Firm* — Kafantaris Law Offices; Theo Kafantaris

(57) ABSTRACT

As such, the present invention will provide a piezoelectric energy-harvesting device in a contact lens that utilizes the multiplicity of constant forces generated by the eye for generating usable energy. The present invention will place a plurality of piezoelectric microdevices in direct or indirect contact with the eye, with the preferred embodiment in the form of a contact lens comprising an array of piezoelectric microdevices at the perimeter of a contact lens. These piezoelectric microdevices will harvest electrical energy generated by the mechanical forces applied by the various activities and movements of the eye, including, but not limited to, winking, squinting, blinking, rolling of the eyes, and vibration of the eyes.

12 Claims, 9 Drawing Sheets

PIEZOELECTRIC ENERGY HARVESTING CONTACT LENS

CROSS-REFERENCE TO RELATED APPLICATIONS

This application claims the benefit of U.S. Provisional Patent Application No. 61/856,661, filed on Jul. 20, 2013, and incorporated herein by reference.

STATEMENT REGARDING FEDERALLY SPONSORED RESEARCH AND DEVELOPMENT

Not Applicable.

FIELD OF THE INVENTION

This invention relates generally to an energy harvesting device, and more particularly, to a piezoelectric energy harvesting contact lens that utilizes the multiple output forces of the eye.

DISCUSSION OF RELATED ART

Piezoelectricity can generally be described as an electrical charge in some solid materials, such as crystals, synthetic ceramics, polymers, biological matter such as bone, and organic nanostructures, with the most common material being the ceramic lead zirconate titanate (PZT). When these materials receive mechanical stress or pressure, their stored energy is released as an electrical charge. Common applications for piezoelectricity include ignition devices, fuses, electric cigarette lighters, photovialtic cells, medical equipment, sensors, and transformers.

Piezoelectricity can be used to power small, even nano-sized electronic devices, and can be stored in a capacitor or a battery. A battery will allow for steadier, lower energy output, while a capacitor will allow for higher energy spike during output. The application of piezoelectricity in microprocessors, network circuits, and other nano-sized devices is typically transmitted wirelessly, as it is generally impractical to power nano-sized devices with large-scale energy sources with direct connectivity.

Piezoelectric thin films are very widely used in microelectromechanical systems (MEMS). Here, thin films of piezoelectric material are used as sensors and actuators, where the piezoelectric material deforms in response to an applied electric field. Piezoelectric thin films have also been used in micro motors and micro gears, where the deformation caused by the applied electrical field is converted into linear or rotary motion.

U.S. Pat. No. 5,914,507 to Polla et al. describes a piezoelectric microdevice which uses thin film piezoelectric materials. Specifically, Polla utilizes a deflectable component which is mounted for deflection on a device substrate which has a sensor/actuator. The sensor/actuator has first and second electrodes with a piezoelectric thin film piezoelectric material disposed between the first and second electrodes. The piezoelectric microdevice of Polla are adapted to stress the piezoelectric thin film material when a voltage is applied, resulting in a mechanical deformation or movement through its piezoelectric effect. This force can be transduced to move or position another object, creating a very precise motor.

Waste energy can generally be described as the process of creating energy from a resource that is intended as waste from a system. Biomechanical energy is an example of an energy source that takes the waste from a given biomechanical process and converts it into energy. Energy harvesting devices harness this waste energy and convert it into renewable sources of energy. For example, energy harvesting devices can be attached to certain parts of the body, such as the knee or mouth, and harness the heat and mechanical force resulting as a byproduct of walking and talking, creating usable energy.

Piezoelectric energy harvesting devices generate low amounts of energy capable of powering network circuits, microprocessors, and other nano-sized electronic devices. Prior experiments show that microscale cofactor and membraneless direct electron transfer based enzymatic fuel cells do produce significant amounts of electrical energy in human lachrymal liquid (tears). This supports the thesis that biofuels found in human lachrymal liquid (tears) do generate enough electrical energy to be used as power sources for piezoelectric contact lenses.

While energy harvesting devices are currently able to convert biological waste energy into renewable sources of energy, there is currently no device which harvests the constant mechanical force generated by the multiplicity of activities and movements of the eye. Furthermore, there are currently no devices which utilize piezoelectric materials in a contact lens when harvesting the eye's waste energy. Therefore, there is a continued need for a piezoelectric energy harvesting device in a contact lens that utilizes the multiplicity of constant mechanical forces generated by the eye for generating usable energy. The present invention satisfies these needs.

SUMMARY OF THE INVENTION

For almost every person awake and interacting with the world, constant use of the eyes are necessary in order to function optimally. As such, the present invention will provide a piezoelectric energy harvesting device in a contact lens that utilizes the multiplicity of constant forces generated by the eye for generating usable energy. The present invention will place a plurality of piezoelectric microdevices in direct or indirect contact with the eye, with the preferred embodiment in the form of a contact lens comprising an array of piezoelectric microdevices at the perimeter of a contact lens. These piezoelectric microdevices will harvest electrical energy generated by the mechanical forces applied by the various activities and movements of the eye, including, but not limited to, winking, squinting, blinking, rolling of the eyes, and vibration of the eyes.

The piezoelectric energy-harvesting contact lens will be worn as ordinary contact lenses, with a piezoelectric circuit embedded within the perimeter of the lens. The piezoelectric materials within the piezoelectric microdevices will actively harvest energy as long as the user's eyes are active. Specifically, the present invention comprises an array of piezoelectric microdevices, a conversion circuit, and an energy storage module. All components are in electrical connection and positioned on an interconnection layer, which is embedded within a contact lens during manufacturing. All modules must be highly flexible and conducive to serve its purpose within the delicate structure in and around the eye.

The piezoelectric microdevices will generate energy through different frequencies corresponding to different eye movements. For example, eyelids have a movement frequency of 60 Hz, while the frequency of winking, squinting, blinking, and rolling of the eyes is lower than 60 Hz. As such, the piezoelectric structure may have a cantilever structure (one clamp), a bridge structure (two clamps), or an enclosed membrane structure, where the resonant frequency of the piezoelectric structure matches the response of all the movements of the eyes. Specifically, having a resonant frequency between 0 Hz to 100 Hz allows voltage generation in all movement frequencies. This voltage generation combined with energy storage in the system allows the device to power other electronic devices.

These and other objectives of the present invention will become obvious to those of ordinary skill in the art after reading the following detailed description of the preferred embodiments. It is to be understood that the foregoing general description and the following detailed description are exemplary, and are intended to provide further explanation of the invention as claimed.

DETAILED DESCRIPTION OF THE PREFERRED EMBODIMENT

Figure 1:
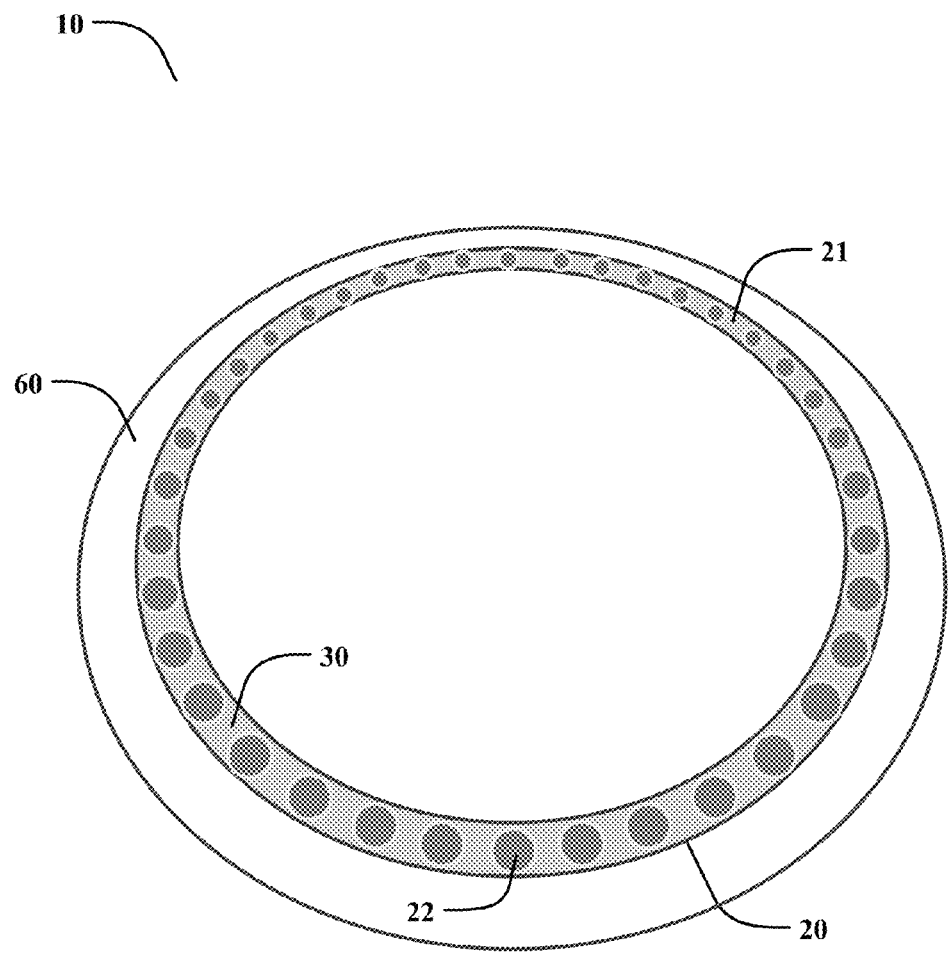
FIG. 1 is an isometric diagram of the present invention.
Figure 2:
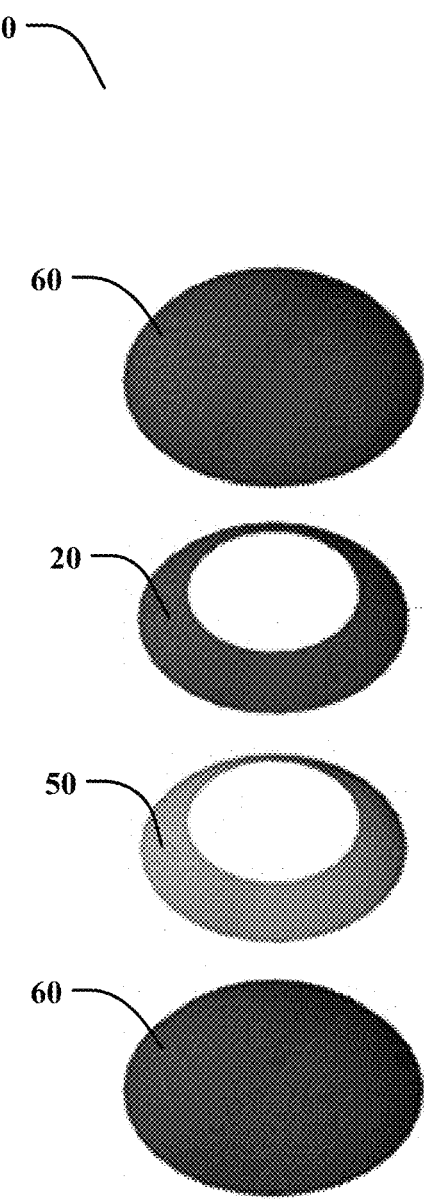
FIG. 2 is an exploded view of the present invention illustrating each layer.
Figure 3:
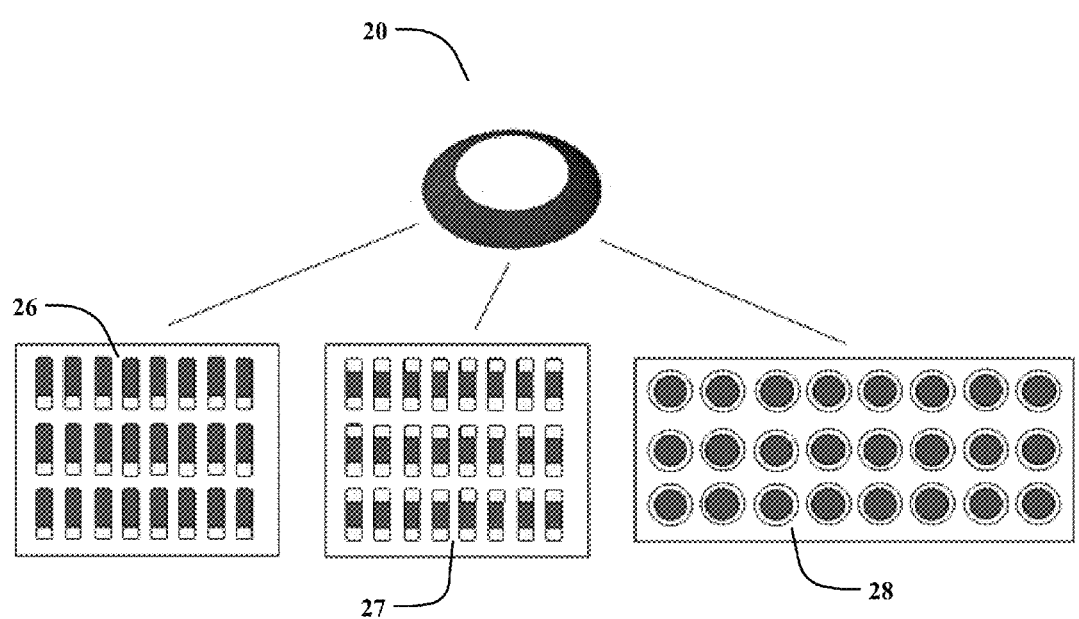
FIG. 3 is a diagram illustrating each type of piezoelectric microdevice structure of the present invention.
Figure 4A:
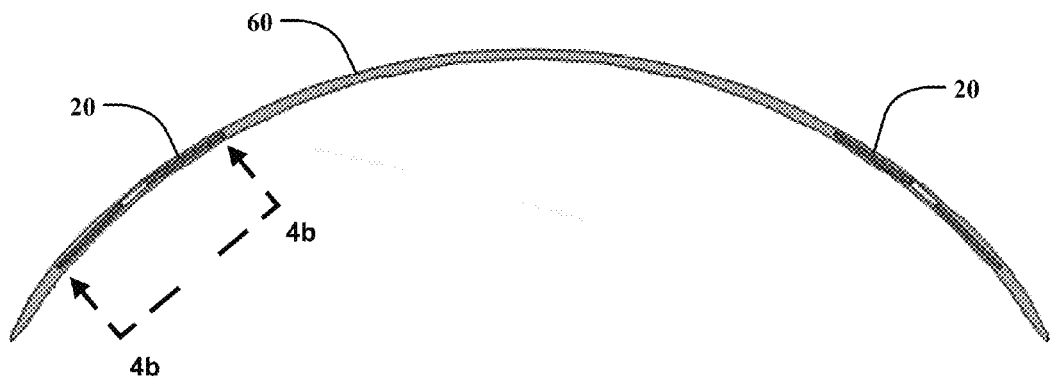
FIG. 4a is a cross-sectional view of the contact lens showing the piezoelectric microdevice array of the present invention.
Figure 4B:
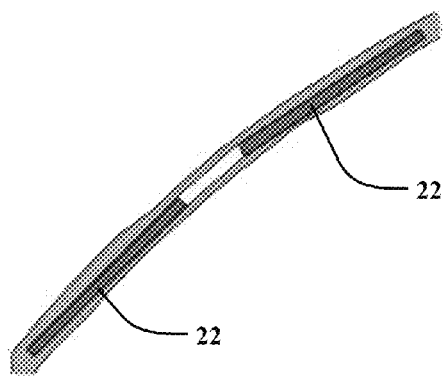
FIG. 4b is a close up cross sectional view of FIG. 4a along line 4b of the contact lens showing the piezoelectric microdevice array of the present invention.
Figure 5A:
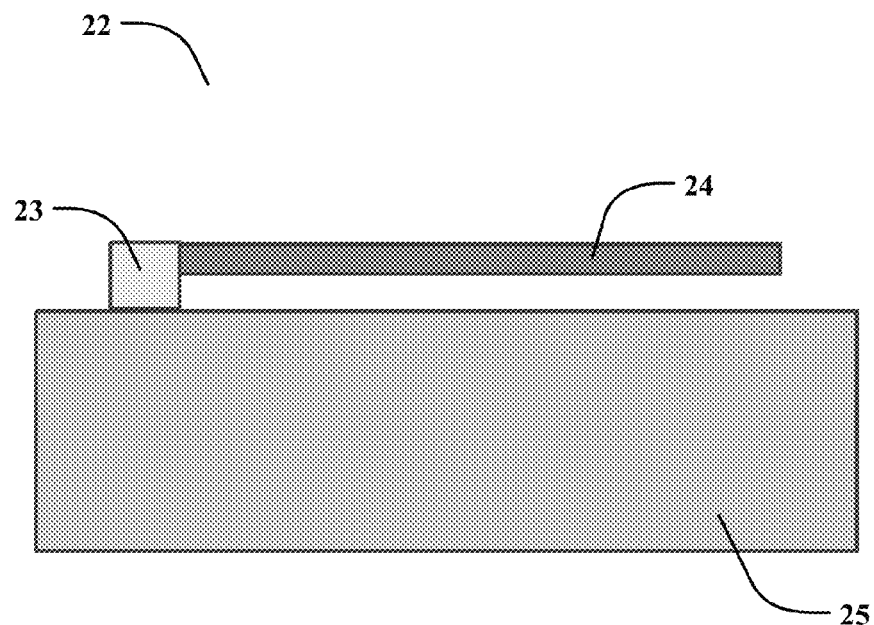
FIG. 5a is a cross-sectional of the present invention illustrating a first embodiment.
Figure 5B:
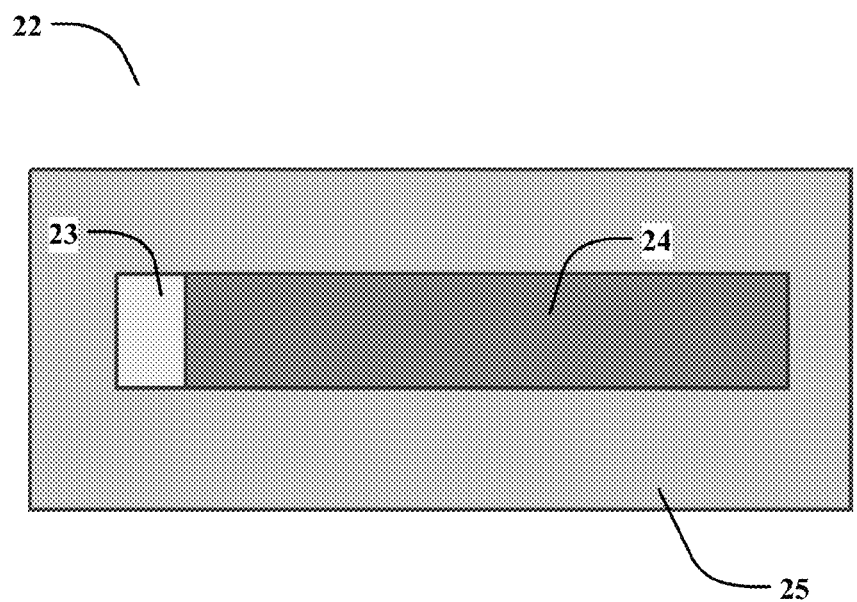
FIG. 5b is a cross-sectional of the present invention illustrating a first embodiment.
Figure 6A:
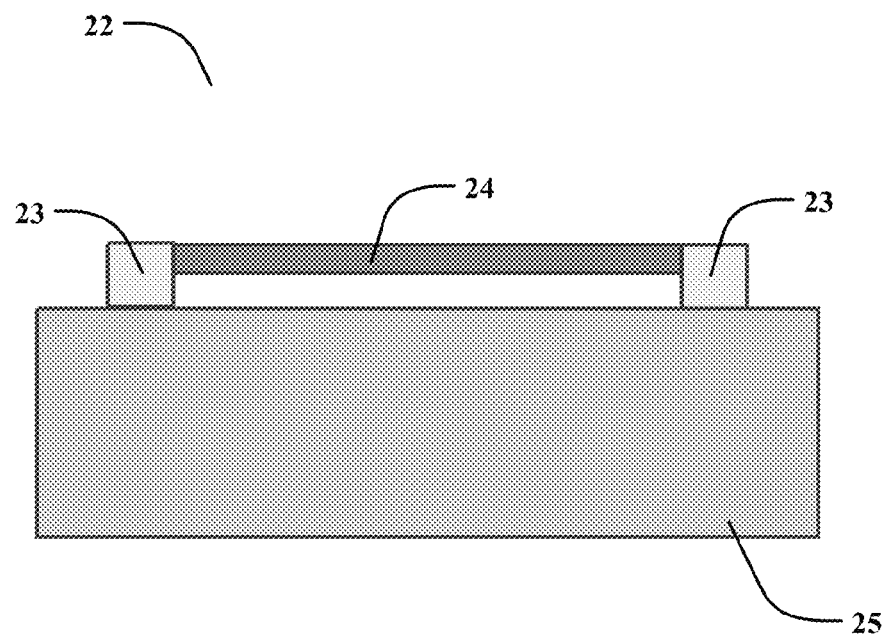
FIG. 6a is a cross-sectional of the present invention illustrating a second embodiment.
Figure 6B:
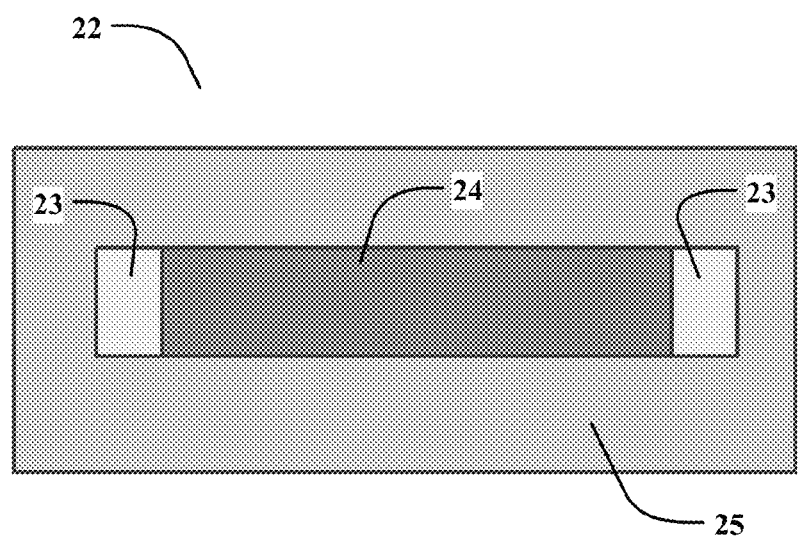
FIG. 6b is a cross-sectional of the present invention illustrating a second embodiment.
Figure 7A:
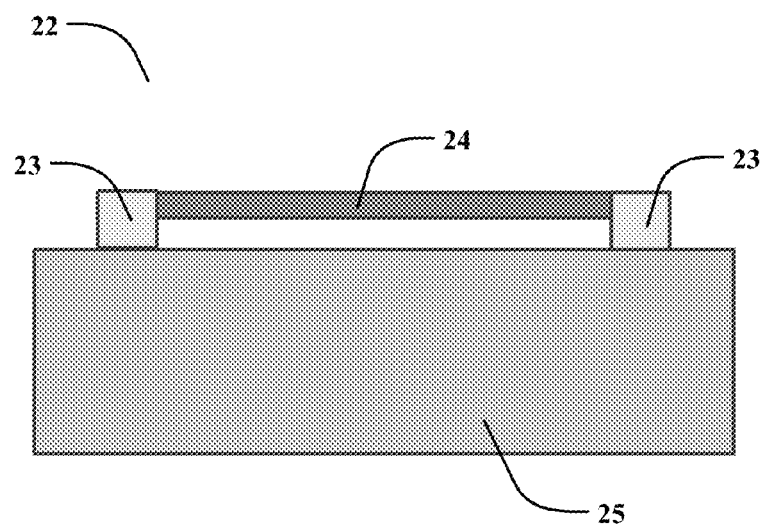
FIG. 7a is a cross-sectional of the present invention illustrating a third embodiment.
Figure 7B:
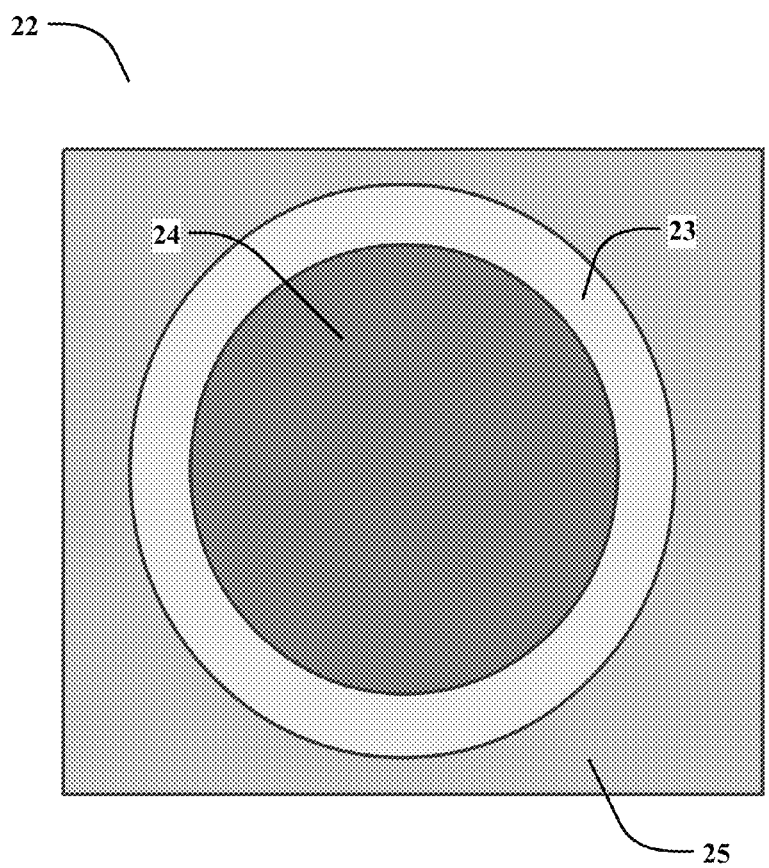
FIG. 7b is a cross-sectional of the present invention illustrating a third embodiment.
Figure 8:
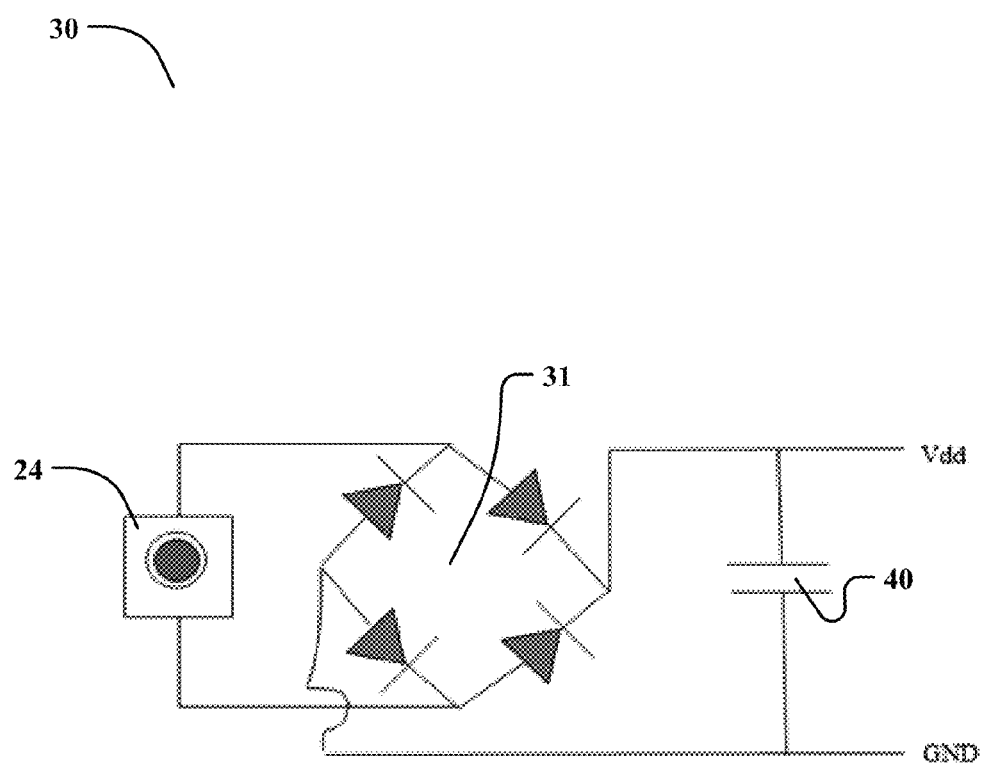
FIG. 8 is a diagram illustrating the conversion circuit of the present invention.
Figure 9:
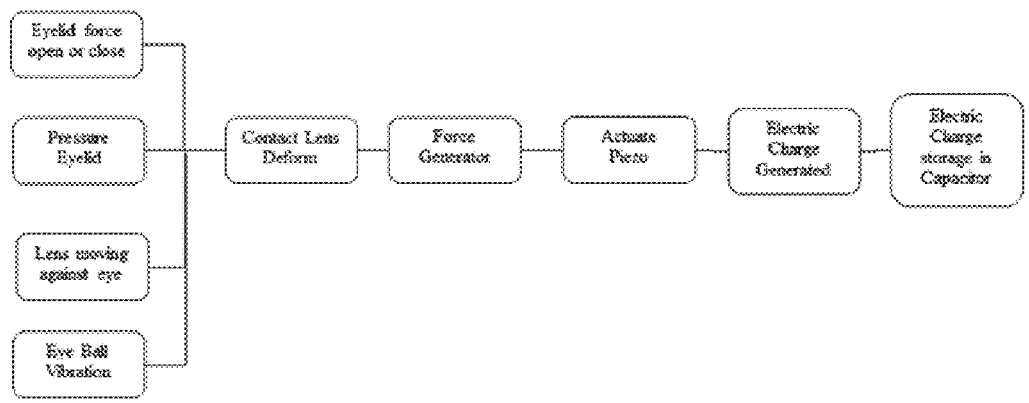
FIG. 9 is a diagram illustrating the flow of the present invention.

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

The present invention 10 comprises an array of piezoelectric microdevices 20, a conversion circuit 30, and an energy storage module 40. All components are in electrical connection and positioned on an interconnection layer 50, which is embedded within a contact lens 60 during manufacturing. The array of piezoelectric microdevices 20 within the contact lens 60 will actively harvest energy as long as the user's eyes are active. All components must be highly flexible and conducive to operate within a stretchable and elastic contact lens 60, and within the delicate structure in and around the eye.

In the preferred embodiment, the array of piezoelectric microdevices 20 are positioned in an array having a spherical shell shape 21. In the preferred embodiment, the dimensions of each piezoelectric microdevice 22 are between 300 um by 1 mm, and as such, a range of 100-1000 piezoelectric microdevices 22 can be included within the array 20. Each piezoelectric microdevice 22 comprises a pair of electrodes 23, a thin film piezoelectric material 24 positioned between the pair of electrodes 23, and a silicone base 25. When the thin film piezoelectric material 24 is deformed from the mechanical forces of the eye, a voltage is applied to the electrodes 23 due to the properties of the thin film piezoelectric material 24.

Each piezoelectric microdevice 22 is adapted to convert the multiplicity of mechanical forces generated by the eye into usable energy. Specifically, each piezoelectric microdevice 22 can generate between 200-500 picowatts/gf. If the force generated by opening and closing the eye is ~135 gf and the pressure from the eyelid on the cornea is ~25 gf, then each piezoelectric microdevice 22 can generate 38 nanowatts for blinks and 7.5 nanowatts due to the pressure on the cornea, for a total of 45.5 nanowatts per blink. With 100 piezoelectric microdevices, this becomes 4.5 microwatts per blink. If the average person blinks 15 times per minute, and the average time of usage for a contact lens is 16 hours, this results in approximately 1 watt per day per eye.

The piezoelectric microdevices 22 will generate energy through different frequencies corresponding to different eye movements. For example, eyelids have a movement frequency of 60 Hz, while the frequency of winking, squinting, blinking, and rolling of the eyes is lower than 60 Hz. As such, the piezoelectric microdevices 22 may have a cantilever structure (one clamp) 26, a bridge structure (two clamps) 27, or an enclosed membrane structure 28, where the resonant frequency of the piezoelectric structure matches the response of all the movements of the eyes. Specifically, having a resonant frequency between 0 Hz to 100 Hz allows voltage generation in all movement frequencies. This voltage generation combined with the energy storage module 40 of the present invention 10 allows the array of piezoelectric microdevices 20 to power other electronic devices.

In an alternative embodiment, each piezoelectric microdevice 22 within the array 20 comprises a cantilever structure 26, where one clamp attaches the thin film piezoelectric material 24 to its silicon base 25, which is attached to the interconnection layer 50. This cantilever structure 26 is adapted to permit one end of the thin film piezoelectric material 24 to remain free to vibrate while the other remains fixed to the base 25. As such, the movements from the eye and eyelid generate force that cause the thin film piezoelectric materials 24 to vibrate and/or deform at a resonant frequency at the free end.

In a further alternative embodiment, each piezoelectric microdevice 22 within the array 20 comprises a bridge structure 27, where a pair of opposing clamps attached to the thin film piezoelectric material 24 to its silicon base 25, which is attached to the interconnection layer 50. Clamping the thin film piezoelectric material 24 on both ends leaves only the middle of the piezoelectric material 24 free to vibrate. Here, movements from the eye and eyelid generate force that causes the thin film piezoelectric materials 24 to vibrate at a resonant frequency at the bridge.

In yet a further alternative embodiment, each piezoelectric microdevice 22 within the material 24 is clamped on all ends, enclosing the membrane completely. Enclosing the entire membrane in the thin film piezoelectric material 24 significantly increases the amount of power generated because the entire vibrating body will have contact with the thin film piezoelectric material 24. In this way, the entire membrane will vibrate, rather than only ends of the device or parts of a bridge.

The thin film piezoelectric materials 24 may comprise synthetic piezoelectric ceramics including, but not limited to, lead zirconate titanate, barium titanate, lead titanate, potassium niobate, lithium niobate, lithium tantalite, sodium tungstate, and zinc oxide. Alternatively, the thin film piezoelectric materials 24 may comprise polymer piezoelectric such as polyvinylidene fluoride. Lastly, biological thin film piezoelectric materials 24 can be used including bone, tendon, silk, wood, enamel, dentin, DNA, and viral protein such as bacteriophage. The electrodes 23 comprise an electrically conductive metallic material.

The conversion circuit 30 is electrically connected to the electrodes 23 of each piezoelectric microdevice 22. The piezoelectric microdevices 22 will generate energy in alternating current (AC) that is of different polarity. As such, the conversion circuit 30 operates as a bridge rectifier adapted to convert the AC into direct current (DC). Specifically, the conversion circuit 30 comprises a diode bridge 31, where the out polarity is the same regardless of input polarity.

The energy storage module 40 is electrically connected to the output of the conversion circuit 30 and is adapted to store the converted electricity. In the preferred embodiment, the energy storage module 40 is a capacitor, which provides quick, high energy storage and output. Alternatively, the energy storage module 40 is a battery, which provides steady, low energy storage and output.

The interconnection layer 50 retains the array of piezoelectric microdevices 20, conversion circuit 30, and energy storage module 40. In the preferred embodiment, the interconnection layer 50 and attached devices are opaque. As such, they must not obstruct the vision correction properties of the contact lens 60. Therefore, the interconnection layer 50 and attached devices have a spherical shell shape 21, with an aperture adapted to permit uninhibited vision therethrough. In an alternative embodiment, the interconnection layer 50 and attached devices are transparent, and as such, will have a semispherical shape (following the shape of the contact lens 60). Here, the piezoelectric microdevice array 20 will cover the entire interconnection layer 50 such that they can harvest the maximum amount of force generated from the eye.

The interconnection layer 50 comprises materials that can generally be understood as insulator materials, which encapsulate the conductive materials of the conversion circuit 30 and piezoelectric microdevice array 20. Insulator materials that are not transparent include polymide, kapton, epoxy plastics, Teflon, fiberglass, while insulator materials that are transparent include silicone, hydrogel, acrylic, SU-8. Conductive materials that are not transparent include metals such as graphite, copper, silver, and gold, while conductive materials that are transparent include indium tin oxide.

The present invention is manufactured such that the components work in conjunction to provide adequate energy harvesting. The method of manufacturing the present invention comprises first attaching and electrically connecting the array of piezoelectric microdevices 20 in a spherical shell shape 21. Next, the conversion circuit 30 is electrically connected to the electrodes 23 of the piezoelectric microdevices 22 within the array 20. Lastly, the energy storage module 40 is electrically connected to the conversion circuit 30. The array of piezoelectric microdevices 20, conversion circuit 30, and energy storage module 40 are all positioned on the outer perimeter of an opaque interconnection layer 50. Alternatively, the array of piezoelectric microdevices 20, conversion circuit 30, and energy storage module 40 are all transparent and positioned throughout the surface of a transparent interconnection layer 50.

Once the piezoelectric circuit is created, it is placed directly into a contact lens mold member, preferably the female mold member, or first (anterior) contact lens mold member. The placement would occur preferably robotically and be coupled with a means of centering the assembly and a means of controlling the depth of the assembly during the filling of the mold with a lens precursor material, which can be understood to be a polymerizable silicone hydrogel lens precursor composition. The polymerizable silicone hydrogel lens precursor composition may be understood to be a pre-polymerized or pre-cured composition suitable for polymerization. In alternative embodiments, the lens precursor material may be comprised of silicone, hydrogel, polyimide, kapton, parylene, or SU-8. Non-stretchable lens precursor materials comprise metals, ceramics, and crystals.

The first contact lens mold member is placed in contact with a second contact lens mold member to form a contact lens mold having a contact lens shaped cavity. Next, the two contact lens mold members are placed in contact with one another to form a contact lens shaped cavity, with the polymerizable silicone hydrogel lens precursor composition and piezoelectric circuit positioned within the contact lens shaped cavity. The polymerizable silicone hydrogel lens precursor composition is then cured to form a pre-extracted polymerized silicone hydrogel contact lens product. The contact lens mold is then demolded, where the two mold members are separated. The pre-extracted polymerized silicone hydrogel contact lens product is then separated from the contact lens mold members, or delensed. After delensing, the pre-extracted silicone hydrogel contact lens product is extracted. After extraction, the extracted polymerized silicone hydrogel contact lens product is hydrated with water or an aqueous solution to form a hydrated silicone hydrogel contact lens.

In view of the above, it can be understood that the pre-extracted polymerized silicone hydrogel contact lens products and the extracted polymerized silicone hydrogel contact lens products are water swellable products or elements, and that the hydrated silicone hydrogel contact lens is a product or element swollen with water. As used herein, a silicone hydrogel contact lens refers to a silicone hydrogel element that has undergone a hydration step. Thus, a silicone hydrogel contact lens can be understood to be a fully hydrated silicone hydrogel contact lens, a partially hydrated silicone hydro gel contact lens, or a dehydrated silicone hydrogel contact lens. A dehydrated silicone hydrogel contact lens refers to a contact lens that has undergone a hydration procedure and has subsequently been dehydrated to remove water from the lens.

After hydrating the extracted silicone hydrogel contact lens product to produce a silicone hydrogel contact lens, the method includes a step of packaging the silicone hydrogel contact lens. For example, the silicone hydrogel contact lens can be placed in a blister pack or other suitable container that includes a volume of a liquid, such as a saline solution, including buffered saline solutions. The stretchable polymer will swell and shrink during manufacture and use, and will generally have a curved or hemispherical shape.

While the above description contains specific details regarding certain elements, sizes, and other teachings, it is understood that embodiments of the invention or any combination of them may be practiced without these specific details. Specifically, although certain materials and shapes are designated in the above embodiments, any suitable materials or shape may be used. These details should not be construed as limitations on the scope of any embodiment, but merely as exemplifications of the presently preferred embodiments. In other instances, well known structures, elements, and techniques have not been shown to clearly explain the details of the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms.

Accordingly, the inventor reserves the right to add additional claims after filing the application to pursue such additional claim forms for other aspects of the invention.

What is claimed is:

1. A piezoelectric energy harvesting contact lens comprising:
   an array of non-inertial mass, thin film piezoelectric microdevices having a frequency conversion rate less than 8 Hz. and having a length and width between 300 um-1 mm;
   said array of non-inertial mass, thin film piezoelectric microdevices further comprising a cantilever structure wherein one clamp attaches a piezoelectric material to a silicon base, and wherein said piezoelectric material is not directly attached to said silicon base;
   a conversion circuit; and
   an energy storage module;
   said array of piezoelectric microdevices, conversion circuit, and energy storage module having electrical connectivity on an interconnection layer;
   said interconnection layer embedded within a contact lens outside of the eye;
   wherein said array of piezoelectric microdevices convert lateral eye movement into energy stored within said energy storage module.

2. The piezoelectric energy harvesting contact lens of claim 1, wherein said array of piezoelectric microdevices further comprise a spherical shell shape on the outer perimeter of a contact lens.

3. The piezoelectric energy harvesting contact lens of claim 1, wherein said array of piezoelectric microdevices further comprise a thin film piezoelectric material positioned between a pair of electrodes.

4. The piezoelectric energy harvesting contact lens of claim 1, wherein said array of piezoelectric microdevices further comprise a bridge structure, wherein two opposing clamps attach a piezoelectric material to a silicon base.

5. The piezoelectric energy harvesting contact lens of claim 1, wherein said array of piezoelectric microdevices further comprise an enclosed membrane structure, wherein a piezoelectric material is attached to a silicon base on all ends.

6. The piezoelectric energy harvesting contact lens of claim 1, wherein said array of piezoelectric microdevices further comprise a piezoelectric material comprising lead zirconate titanate, barium titanate, lead titanate, potassium niobate, lithium niobate, lithium tantalite, sodium tungstate, zinc oxide, polyvinylidene fluoride, bone, tendon, silk, wood, enamel, dentin, DNA, and viral proteins.

7. The piezoelectric energy harvesting contact lens of claim 1, wherein said conversion circuit further comprises a diode bridge electrically connected to said array of piezoelectric microdevices adapted to convert alternating current to direct current.

8. The piezoelectric energy harvesting contact lens of claim 7, wherein said energy storage module is a capacitor electrically connected to said conversion circuit.

9. The piezoelectric energy harvesting contact lens of claim 7, wherein said energy storage module is a battery electrically connected to said conversion circuit.

10. The piezoelectric energy harvesting contact lens of claim 1, wherein said interconnection layer retains said array of piezoelectric microdevices, conversion circuit, and energy storage module.

11. The piezoelectric energy harvesting contact lens of claim 1, wherein said interconnection layer, array of piezoelectric microdevices, conversion circuit, and energy storage module are opaque and have a spherical shell shape with an aperture adapted to permit uninhibited vision therethrough when said contact lens is worn.

12. The piezoelectric energy harvesting contact lens of claim 1, wherein said interconnection layer, array of piezoelectric microdevices, conversion circuit, and energy storage module are transparent and have a semispherical shape, wherein said array of piezoelectric microdevices cover the entire interconnection layer such that they can harvest the maximum amount of force generated from the eye.

* * * * *